United States Patent
Wu

(10) Patent No.: US 10,634,335 B2
(45) Date of Patent: Apr. 28, 2020

(54) EASILY FORMED LIQUID COOLING MODULE OF AN LED LAMP

(71) Applicant: FUJIAN SANAN SINO-SCIENCE PHOTOBIOTECH CO., LTD., Quanzhou (CN)

(72) Inventor: Chanjuan Wu, Xiamen (CN)

(73) Assignee: FUJIAN SANAN SINO-SCIENCE PHOTOBIOTECH CO., LTD., Quanzhou (CN)

( * ) Notice: Subject to any disclaimer, the term of this patent is extended or adjusted under 35 U.S.C. 154(b) by 0 days.

(21) Appl. No.: 16/098,756

(22) PCT Filed: Oct. 27, 2017

(86) PCT No.: PCT/CN2017/107947
§ 371 (c)(1),
(2) Date: Nov. 2, 2018

(87) PCT Pub. No.: WO2018/133481
PCT Pub. Date: Jul. 26, 2018

(65) Prior Publication Data
US 2019/0137088 A1  May 9, 2019

(30) Foreign Application Priority Data
Jan. 18, 2017 (CN) .......................... 2017 1 0036871
Jan. 18, 2017 (CN) ...................... 2017 2 0062994 U

(51) Int. Cl.
*F21V 29/56* (2015.01)
*F21V 29/89* (2015.01)
(Continued)

(52) U.S. Cl.
CPC ............ *F21V 29/56* (2015.01); *F21V 29/503* (2015.01); *F21V 29/508* (2015.01); *F21V 29/74* (2015.01);
(Continued)

(58) Field of Classification Search
CPC .......... F21V 29/503; F21V 29/56; H05K 7/20
See application file for complete search history.

(56) References Cited

U.S. PATENT DOCUMENTS

| 8,638,027 B2 * | 1/2014 | Van Dijk ................ F21V 29/74 313/46 |
| 2005/0077028 A1 * | 4/2005 | Oikawa ................... F28D 15/02 165/80.4 |
| 2013/0170176 A1 | 7/2013 | Athalye |

FOREIGN PATENT DOCUMENTS

| CA | 2955273 A1 * | 1/2016 | ............. F21V 29/58 |
| CN | 2723833 Y | 9/2005 | |

(Continued)

OTHER PUBLICATIONS

Machine translation of CN204634236 (Year: 2015).*

*Primary Examiner* — Joseph L Williams
*Assistant Examiner* — Jacob R Stern
(74) *Attorney, Agent, or Firm* — Cooper Legal Group, LLC

(57) ABSTRACT

A liquid cooling module of an LED lamp, including a cooling body, two plugs and a heat source. The cooling body is formed with connected liquid flowing passages, and has the two plugs coupled to the two sides thereof. An inlet of each liquid flowing passage and an outlet of the adjacent liquid flowing passage are located at the same side of the cooling body. The inlet of the first liquid flowing passage is connected to an inlet hole of the plug at the same side. The liquid inlet of each liquid flowing passage besides the first one is connected to the outlet of the previous liquid flowing passage by a connecting groove of a corresponding plug. The outlet of the last liquid flowing passage is connected to an outlet hole of the plug at the same side.

20 Claims, 6 Drawing Sheets

(51) Int. Cl.
    *F21V 29/503*    (2015.01)
    *F21V 29/508*    (2015.01)
    *F21V 29/74*     (2015.01)
    *H05K 7/20*     (2006.01)
    *F21Y 115/10*    (2016.01)
    *F21Y 105/16*    (2016.01)

(52) U.S. Cl.
    CPC ............... *F21V 29/89* (2015.01); *H05K 7/20* (2013.01); *F21Y 2105/16* (2016.08); *F21Y 2115/10* (2016.08)

(56) References Cited

FOREIGN PATENT DOCUMENTS

| | | |
|---|---|---|
| CN | 201623945 U | 11/2010 |
| CN | 203399460 U | 1/2014 |
| CN | 203718703 U | 7/2014 |
| CN | 104457347 A | 3/2015 |
| CN | 204437768 U | 7/2015 |
| CN | 204461167 U | 7/2015 |
| CN | 204634236 U | 9/2015 |
| CN | 105338796 A | 2/2016 |
| CN | 205350903 U | 6/2016 |
| CN | 105810805 A | 7/2016 |
| CN | 205843141 U | 12/2016 |
| CN | 106793709 A | 5/2017 |
| CN | 206488251 U | 9/2017 |
| EP | 2840875 A1 | 2/2015 |
| JP | 2006344636 A | 12/2006 |

* cited by examiner

EASILY FORMED LIQUID COOLING MODULE OF AN LED LAMP

TECHNICAL FIELD

The present invention relates to an easily formed liquid cooling module of an LED lamp.

RELATED ART

Existing liquid cooling devices mainly adopts the two kinds of structures: 1. One structure has two boards arranged up and down; the top and bottom boards are respectively engraved with waterways by machines; two boards are then shut up with a sealing ring; 2. The other structure uses heating pipe or cooper pipe as liquid carrier; the looping position is welded. This two manufacturing methods not only cost high but also have low efficiency that they do not suit for mass manufacture.

Also, water cooling technology is limited in LED lamps.

SUMMARY OF THE INVENTION

The present invention is provided with an easily formed liquid cooling module of an LED lamp, which overcomes the disadvantages of the existing known technology.

The technical solution of the present invention is that:

An easily forming liquid cooling module of an LED lamp, wherein comprising a cooling body, two plugs and a heat source or heat sources; the cooling body is formed with liquid flowing passages of step-by-step connected; two plugs are respectively coupled to the two sides of the liquid flowing passages; an liquid inlet of each liquid flowing passage and an liquid outlet of the adjacent liquid flowing passage are located at the same side of the cooling body; the liquid inlet of the first liquid flowing passage is connected to an inlet hole of the plug at the same side as the first liquid flowing passage; the liquid outlet of the last liquid flowing passage is connected to an outlet hole of the plug at the same side as this last liquid flowing passage; the liquid inlet of each liquid flowing passage besides the first one is connected to the liquid outlet of the previous liquid flowing passage by a connecting groove of the corresponding plug.

In another preferred embodiment, the cooling body is a cooling board, the liquid flowing passages are integrally formed by metal or non-metallic material of high thermal conductivity.

In another preferred embodiment, the cooling body is a cooling board whose liquid flowing passages are formed by aluminum extrusion.

In another preferred embodiment, the number of the liquid flowing passages is even, the inlet hole and the outlet hole are disposed at the same plug; or the number of the liquid flowing passages is an odd number greater than one, the inlet hole is disposed at one plug, the outlet hole is disposed at the other plug, each plug is disposed with at least one connecting groove.

In another preferred embodiment, the inlet hole comprises a circular hole section and a joint hole section disposed inside the circular hole section and connected to the liquid inlet of the first liquid flowing passage; two ends of the joint hole section are respectively transited to the circular hole section by a slanted surface.

In another preferred embodiment, the outlet hole comprises a circular hole section and a joint hole section disposed inside the circular hole section and connected to the liquid outlet of the last liquid flowing passage; two ends of the joint hole section are respectively transited to the circular hole section by a slanted surface.

In another preferred embodiment, the section area of the joint hole section is larger than that of the liquid flowing passage.

In another preferred embodiment, the section area of the connecting groove is larger than the section area of the liquid flowing passage, the section area of the connecting groove is flat, two side walls at the width and/or length of the connecting groove are transited to the bottom surface of the connecting groove in a shape of right angle or rounded angle, the semi-diameter of the rounded angle is smaller than a preset value.

In another preferred embodiment, the cross section of the connecting groove is in a shape of waist or other shapes easily connecting two holes.

In another preferred embodiment, the heat source or heat sources are selected from LED light sources, driving sources and the combination, the heat source or heat sources are connected to the cooling body.

In another preferred embodiment, the wall of the liquid flowing passage is disposed with a plurality of thermal fins spaced arranged, each thermal fin is arranged along the flowing direction, a base of each thermal fin and the cooling body are integrally formed, a gap is disposed between a tail of each thermal fin and the side wall of the corresponding liquid flowing passage or the opposite thermal fin.

In another preferred embodiment, the top wall or bottom wall of the liquid cooling passage is disposed with a plurality of thermal fins spaced arranged.

In another preferred embodiment, the width of the thermal fin is gradually increased from the tail portion to the base portion.

Compared with the existing known technology, the present invention has advantages as follows:

1. The liquid flowing passages are formed in the cooling body, and one single or more than one liquid flowing loops are formed by the liquid flowing passages with the two plugs; the present invention is simple to manufacture and low cost, and suitable for mass manufacturing.

2. The inlet hole/outlet hole comprises a circular hole section and a joint hole section disposed inside the circular hole section; two ends of the joint hole section are respectively transited to the circular hole section by a slanted surface. On one hand, the present invention is easy for connecting pipes at the circular hole section, on the other hand, the slanted surface for transiting provides an uniformly flowing of the inlet hole and the outlet hole and prevents stress concentration.

3. The cross section of the connecting groove is flat, waist shape preferred. Two side walls at the width and the length of the connecting groove are transited to the bottom surface of the connecting groove in a shape of right angle or rounded angle, the semi-diameter of the rounded angle is as small as possible that can reduce the surface quality need of the wall surface and prevent overlarge of stress and reduce flowing resistance.

4. The liquid flowing passage of the present invention is disposed with a plurality of thermal fins; each thermal fin is disposed along the liquid flowing direction; the base portion of the thermal fin and the cooling device are integrally formed. A gap is formed between the tail portion of the thermal fin and the wall surface of the liquid flowing passage or the opposite thermal fin, so the present invention does not block the flowing of the cooling liquid in the liquid flowing passage and greatly increases the contact surface of the cooling liquid and the cooling device, thus greatly improving the heat exchange and the heat dissipation effect of the LED lamp, particularly high power LED lamp.

The present invention will be further described in accordance with the drawings and embodiments; however, it should be noted that the scope of the present invention is not limited to the embodiments.

BELIEF DESCRIPTION OF THE DRAWINGS

DETAILED DESCRIPTION OF THE EMBODIMENTS

Figure 1:
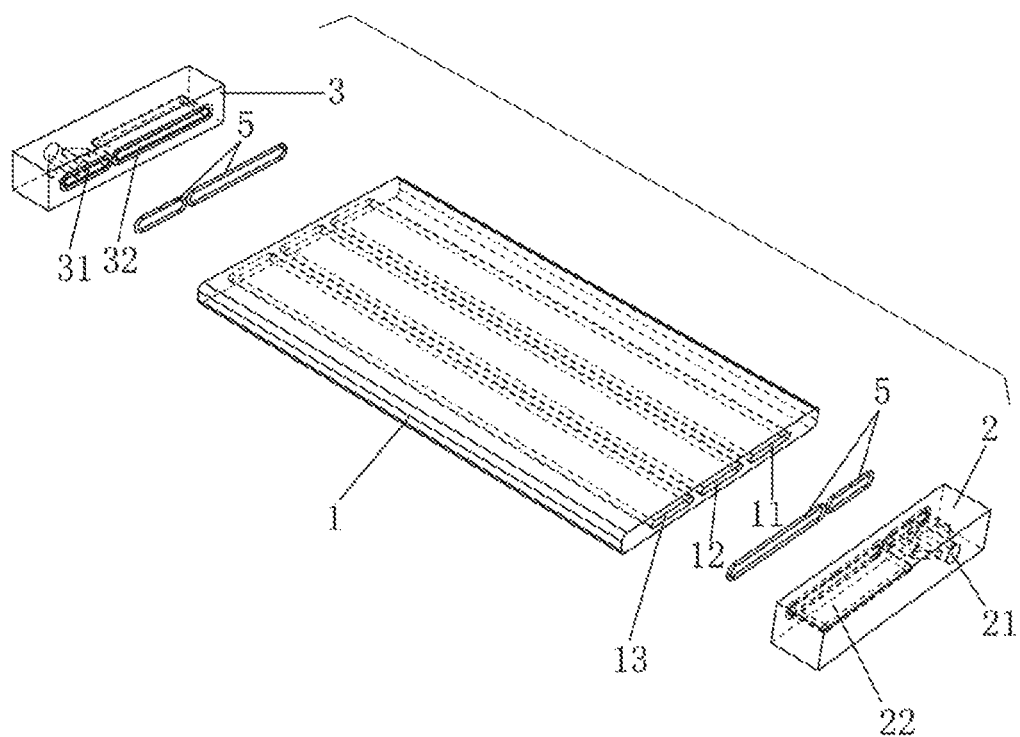
FIG. 1 illustrates an exploded diagram of a liquid cooling module of Embodiment 1 of the present invention.
Figure 2:
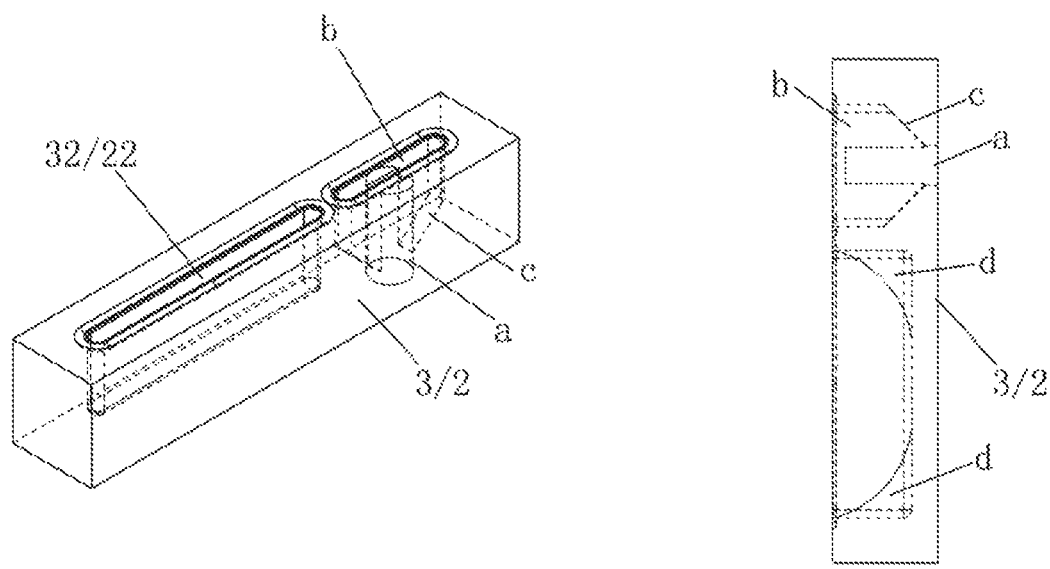
FIG. 2 illustrates a schematic diagram of a plug of Embodiment 1 of the present invention.
Figure 3:
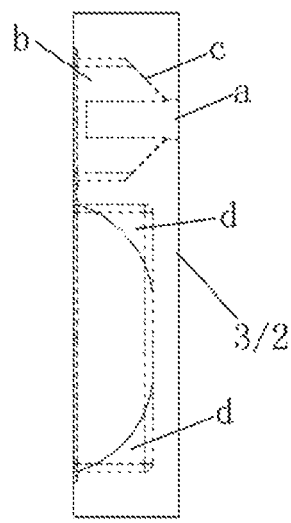
FIG. 3 illustrates a top view of the plug of Embodiment 1 of the present invention.
Figure 4:
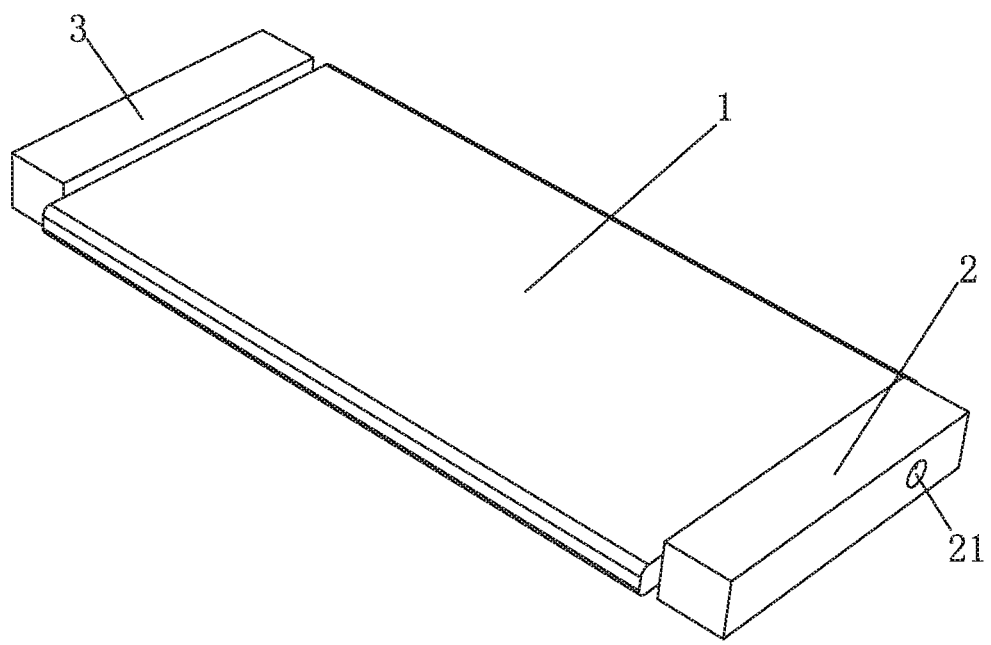
FIG. 4 illustrates a schematic diagram of the liquid cooling module of Embodiment 1 of the present invention.
Figure 5:
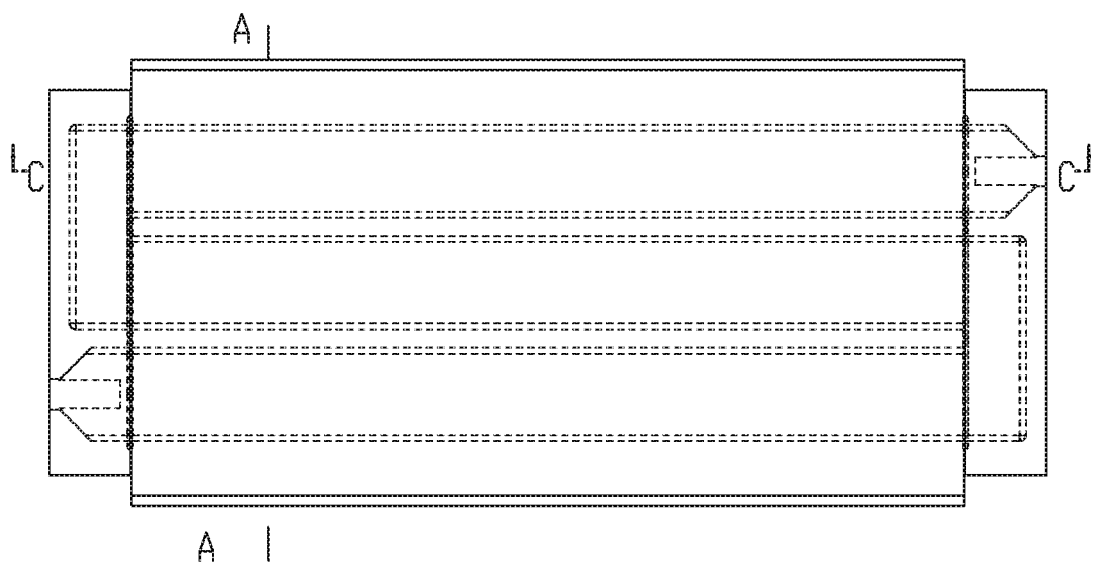
FIG. 5 illustrates a top view of the liquid cooling module of Embodiment 1 of the present invention.
Figure 6:
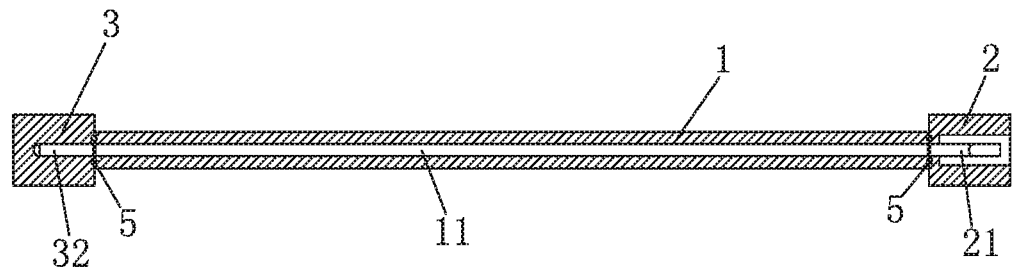
FIG. 6 illustrates a sectional diagram of Embodiment 1 of the present invention in C-C.

Embodiment 1: referring to FIGS. 1-7, an easily forming liquid cooling module of an LED lamp of the present invention comprising a cooling body, two plugs 2 and 3 and a heat source; the cooling body is a cooling board 1 formed with liquid flowing passages of step-by-step connected, the liquid flowing passages are integrally formed by metal or non-metallic material of high thermal conductivity. An liquid inlet of each liquid flowing passage and an liquid outlet of the adjacent liquid flowing passage are located at the same side of the cooling body 1. The two plugs 2 and 3 are respectively coupled to the two sides of the liquid flowing passages in sealing way; the liquid inlet of the first liquid flowing passage is connected to an inlet hole of the plug at the same side as the first liquid flowing passage; the liquid outlet of the last liquid flowing passage is connected to an outlet hole of the plug at the same side as this last liquid flowing passage; the liquid inlet of each liquid flowing passage besides the first one is connected to the liquid outlet of the previous liquid flowing passage by a connecting groove of the corresponding plug.

In this embodiment, the number of the liquid flowing passages is an odd number greater than one, taking three for example (it should be noted that the number of the liquid flowing passages is not limited to three), they are the first liquid flowing passage 11, the second liquid flowing passage 12 and the last liquid flowing passage 13. The inlet hole 21 is disposed at one plug 12, the outlet hole 31 is disposed at the other plug 3; the plug 2 is disposed with connecting groove 22, the plug 3 is disposed with a connecting groove 32.

In this embodiment, the inlet hole 21 and the outlet hole 31 respectively comprises a circular hole section a and a joint hole section b disposed inside the circular hole section a; two ends along the length direction of the joint hole section b are respectively transited to the circular hole section a by a slanted surface c. In detail, the cross section of the outer end of the joint hole section b is in a shape of waist. With the circular hole section a, the inlet hole 21 and the outlet hole 31 are easy for connecting pipes, the slanted surface for transiting provides an uniformly flowing of the inlet hole 21 and the outlet hole 31 and prevents stress concentration.

In this embodiment, the section area of the connecting groove 22 and 32 is larger than the section area of the liquid flowing passage, the cross section of the connecting groove is flat, waist shape in detail. Two side walls at the width and the length of the connecting groove 22 and 32 are transited to the bottom surface of the connecting groove 22 and 32 in a shape of rounded angle, the semi-diameter of the rounded angle is smaller than a preset value and is as small as possible, making the two sides at the length direction of the bottom portion inner the connecting groove 22 and 32 form a pressure relief area d, as figured in FIG. 3, that prevents overlarge of stress and reduces flowing resistance. The section area is vertical to the length direction of the cooling device.

In this embodiment, two plugs 2 and 3 are coupled to the cooling board 1 by sealing rings 4. in detail, the end face of the two plugs 2 and 3 jointing the cooling board 1 is embedded with the sealing ring 5, and the groove opening of the connecting groove 22 and 32, the liquid outlet of the inlet hole 21 and the liquid inlet of the outlet hole 31 are located in the range of the sealing ring.

Figure 7:
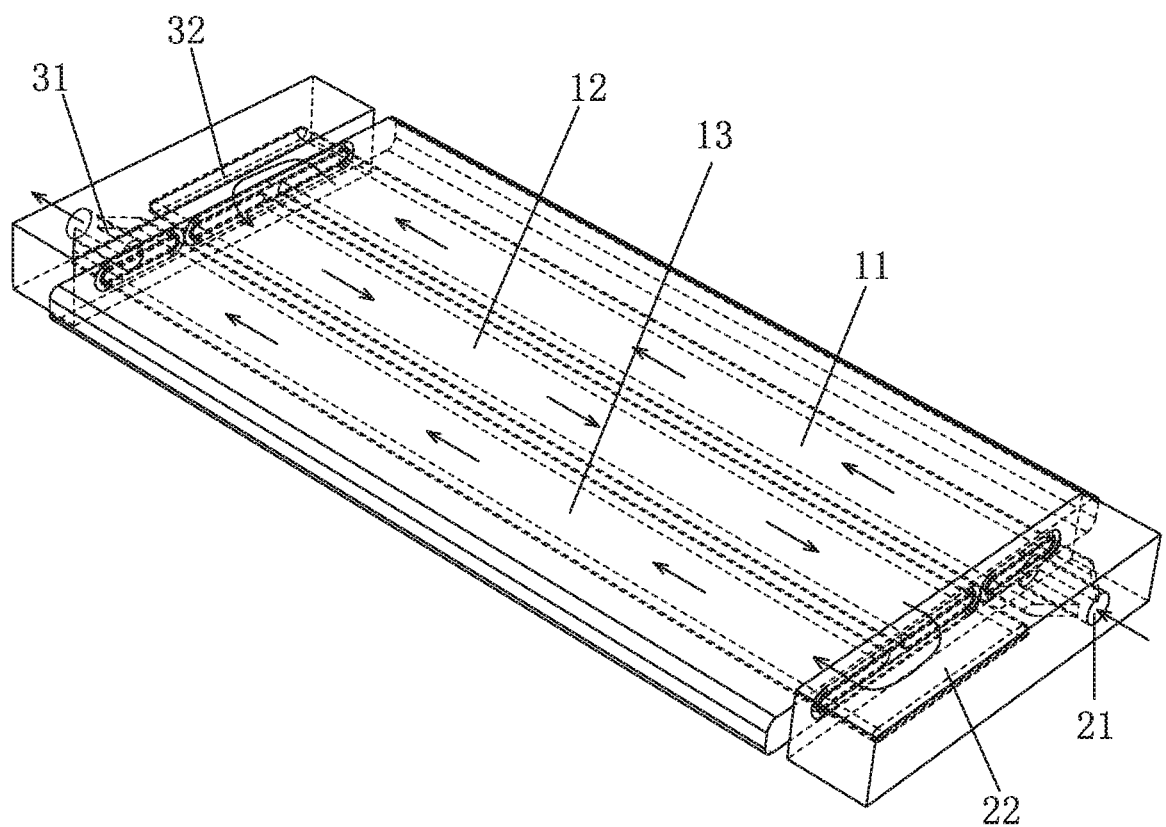
FIG. 7 illustrates a schematic diagram of the liquid flowing direction of Embodiment 1 of the present invention.

The liquid flowing direction of the present invention is as figured in FIG. 7, the cooling liquid, which can be cool water, flows from the inlet hole 21 of one plug 2 to the first liquid flowing passage 11, and turns to the second liquid flowing passage 12 through the connecting groove 32 of the other plug 3, then turns to the last liquid flowing passage 13 through the connecting groove 22 of the plug 2, finally flows out of the outlet hole 31 of the other plug 3. The cooling liquid heat exchanges with the cooling board 1 during flowing in the cooling board 1 and flows out and takes the heat out.

Figure 8:
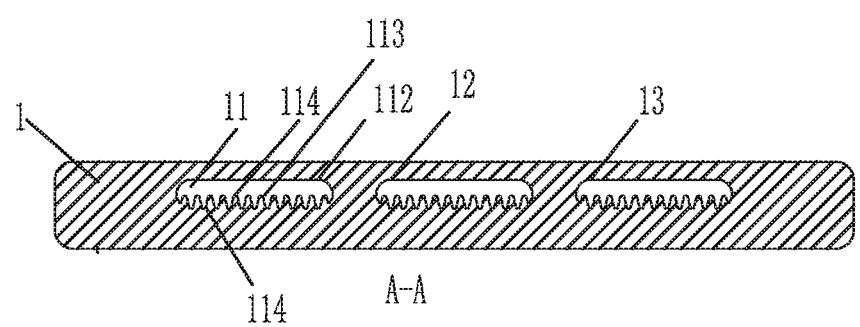
FIG. 8 illustrates a sectional diagram of Embodiment 1 of the present invention in A-A.

As figured in FIG. 1 and FIG. 8, the easily forming liquid cooling module of an LED lamp is provided that the cooling board 1 is disposed, in order, with the first liquid flowing passage 11, the second liquid flowing passage 12 and the last liquid flowing passage 13. The side wall of the liquid flowing passage 11 is disposed with a plurality of thermal fins 113 spaced arranged along a direction vertical to the liquid flowing direction. Each thermal fin 113 is elongated and arranged along the liquid flowing direction (namely the flowing direction of the cooling liquid), the base portion 115 of the thermal fin 113 and the cooling board 1 are integrally formed. A gap is disposed between the tail portion 114 of the thermal fin 113 and the side wall of the corresponding liquid flowing passage 11 or the opposite thermal fin. That is to say, the tail portion 114 of the thermal fin 113 is a free end, the thermal fins 113 does not divide the liquid flowing passage to several independent small passages, and the liquid flowing passage 11 keeps an entire passage. The cooling board 1 is formed with the liquid flowing passages 11 and the thermal fins 113 by aluminum squeezing method. The external surface of the cooling board 1 at the tail portion 115 of the thermal fin 113 is heat resource contact surface, which is flat. In this embodiment, the cross section of liquid flowing passage 11 is elongated, rectangle detailed (or square or waist), the liquid flowing passage 11 is along the length direction of the cooling board 1. The top wall 111 of the liquid flowing passage 11 is disposed with a plurality of thermal fins 113 spaced arranged, correspondingly, the top surface 134 of the cooling board 1 is the contact surface of heat source. The heat source is an LED lamp. The tail portion 114 of each thermal fin is a free end, and a gap is disposed between the tail of the thermal fin and the bottom wall 112 of the liquid flowing passage 112 that prevents the thermal fin 113 from dividing the liquid flowing passage to several independent small passages that results in increasing of flowing resistance of the cooling liquid.

In this embodiment, the width of the thermal fin 113 is gradually increased from the tail portion 114 to the base portion 115, providing the section conical shaped. This solves the problems of overlarge of thermal resistance of thin fin and increased cost of thick fin. That is to say, the cross section of the thermal fin 113 is conical shaped that it not only has a suitable thermal resistance but also reduces the maternal cost.

Figure 9:
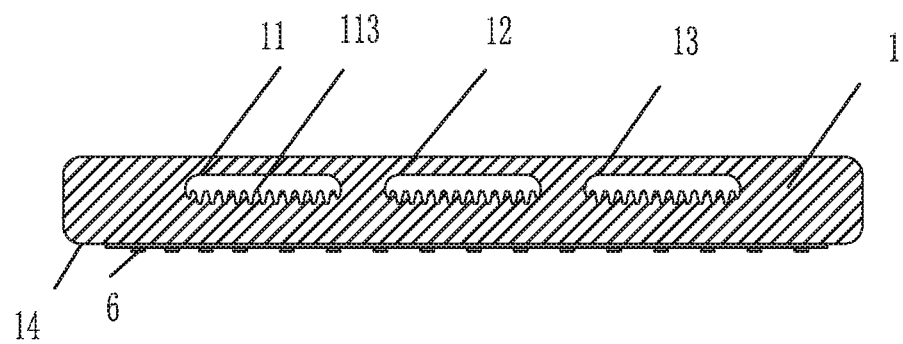
FIG. 9 illustrates a sectional diagram of an LED lamp of Embodiment 2 of the present invention.
Figure 10:
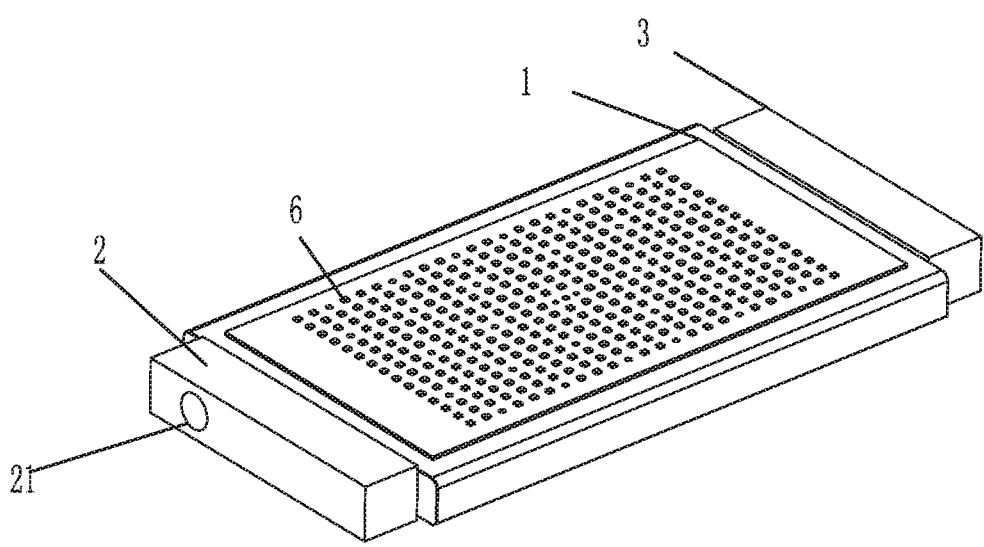
FIG. 10 illustrates a schematic diagram of the LED lamp of Embodiment 2 of the present invention.

Embodiment 2: as figured in FIG. 9 and FIG. 10, an LED lamp with an easily forming liquid cooling module comprises the cooling board 1 and the two plugs 2 and 3 in Embodiment 1, the heat sources are the LED lamps 6, which are located on the top surface 14 of the cooling board 1.

The easily forming liquid cooling module of the present invention can be applied in an LED lamp or other products for heat dissipation.

The heat source or heat sources are selected from LED light sources, driving sources and the combination, but not limited.

In another embodiment, it comprises an even number of liquid flowing passages, whose inlet holes and outlet holes are disposed at the same plug.

In another embodiment, there is only one liquid flowing passage, whose liquid inlet is connected to the inlet hole of one plug and whose liquid outlet is connected to the outlet hole of the other plug.

Figure 11:
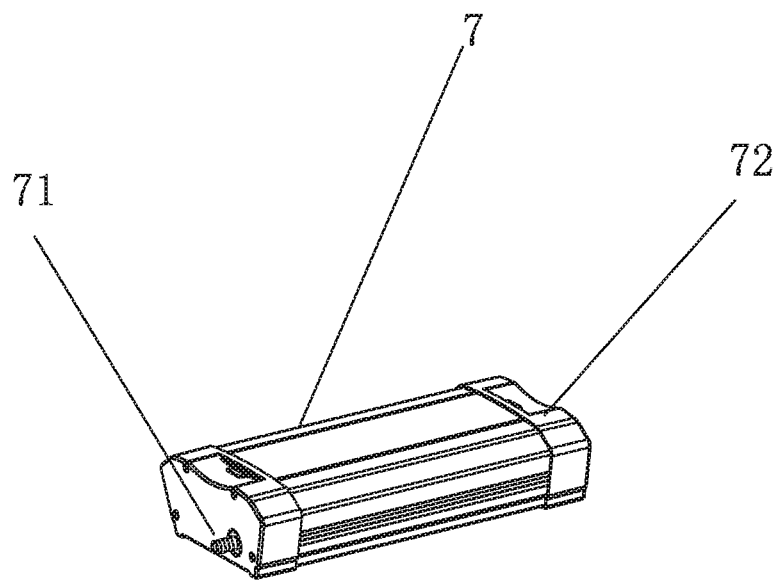
FIG. 11 illustrates a schematic diagram of a single lamp of an LED lamp net of Embodiment 3 of the present invention.
Figure 12:
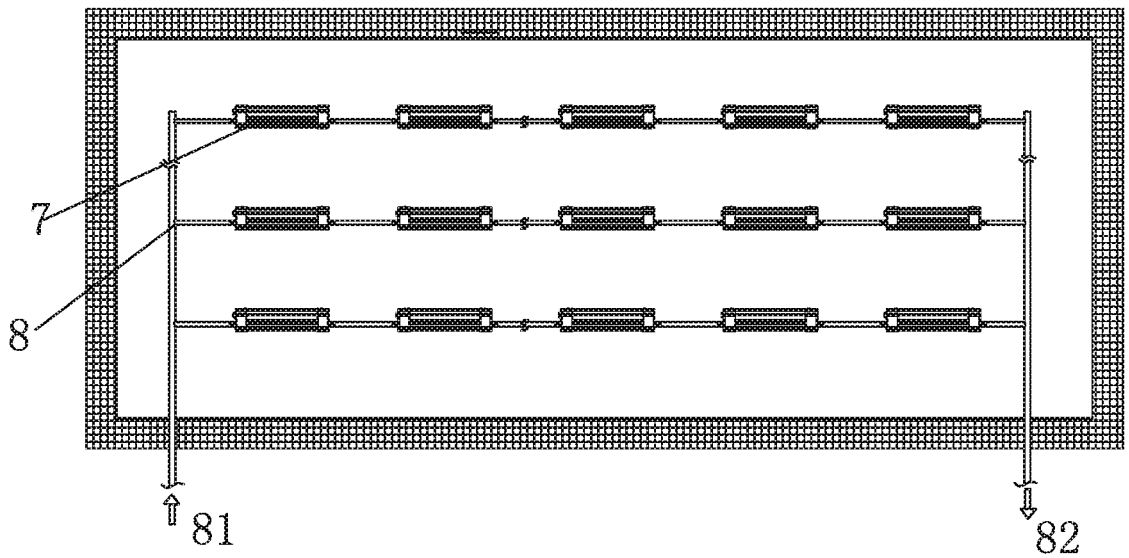
FIG. 12 illustrates a schematic diagram of the LED lamp net of Embodiment 3 of the present invention.

Embodiment 3: as figured in FIG. 11 and FIG. 12, an LED lamp net with easily forming liquid cooling module comprises LED lamps 7 as mentioned in Embodiment 2, the inlet 71 and outlet 72 of the LED lamps are serious connected by pipes 8 to form branches, or the branches are parallel connected to form the net. The inlet 81 and outlet 82 of the pipes 8 are disposed outdoor. In this embodiment, the LED lamp net has the heat of the LED lamps 7 taken out by the liquid in the pipes that it has good heat dissipation effect.

Although the present invention has been described with reference to the preferred embodiments thereof for carrying out the patent for invention, it is apparent to those skilled in the art that a variety of modifications and changes may be made without departing from the scope of the patent for invention which is intended to be defined by the appended claims.

INDUSTRIAL APPLICABILITY

The present invention is provided with an easily forming liquid cooling module and an LED lamp. The cooling body is formed with a plurality of liquid flowing passage. The present invention is simple and low cost, and suitable for mass manufacturing.

The invention claimed is:

1. A liquid cooling module of a light emitting diode (LED) lamp, comprising:
a cooling body,
two plugs, and
at least one heat source; wherein:
the cooling body is formed with side by side liquid flowing passages contained therein;
a first plug of the two plugs is coupled to a first side of the side by side liquid flowing passages;
a second plug of the two plugs is coupled to a second side of the side by side liquid flowing passages;
for each liquid flowing passage of the side by side liquid flowing passages, a liquid inlet of the liquid flowing passage is located on a same side of the cooling body as a liquid outlet of an adjacent liquid flowing passage of the side by side liquid flowing passages;
a liquid inlet of a first liquid flowing passage of the side by side liquid flowing passages is connected to an inlet hole of one of the two plugs at a same side of the first liquid flowing passage as the liquid inlet of the first liquid flowing passage;
a liquid outlet of a last liquid flowing passage of the side by side liquid flowing passages is connected to an outlet hole of one of the two plugs at a same side of the last liquid flowing passage as the liquid outlet of the last liquid flowing passage; and
for each liquid flowing passage of the side by side liquid flowing passages besides the liquid inlet of the first liquid flowing passage, the liquid inlet of the liquid flowing passage is connected to the liquid outlet of the adjacent liquid flowing passage by a connecting groove of a corresponding one of the two plugs such that liquid, when present in the liquid flowing module, contacts a wall of the corresponding one of the two plugs defining the connecting groove.

2. The liquid cooling module of an LED lamp according to claim 1, wherein:
the cooling body is a cooling board; with the side by side liquid flowing passages; and
the cooling body is integrally formed by metal or non-metallic material of high thermal conductivity.

3. The liquid cooling module of an LED lamp according to claim 1, wherein:
the cooling body is a cooling board with the side by side liquid flowing passages; and
the cooling body is formed by aluminum extrusion.

4. The liquid cooling module of an LED lamp according to claim 1, wherein:
when the number of the side by side liquid flowing passages is even, the inlet hole and the outlet hole are disposed on the first plug; and
when the number of the side by side liquid flowing passages is an odd number greater than one, the inlet hole is disposed on the first plug, the outlet hole is disposed on the second plug, and the first plug and the second plug are respectively disposed with at least one connecting groove.

5. The liquid cooling module of an LED lamp according to claim 1, wherein:
the inlet hole comprises a circular hole section and a joint hole section;
a first end of the joint hole section is connected to the liquid inlet of the first liquid flowing passage; and
a second end of the joint hole section is connected to an outer circumference of a middle portion of the circular hole section by a slanted surface.

6. The liquid cooling module of an LED lamp according to claim 5, wherein:
   a section area of the joint hole section is larger than a section area of the first liquid flowing passage; and
   a section area of the joint hole section is larger than a section area of the last liquid flowing passage.

7. The liquid cooling module of an LED lamp according to claim 6, wherein a cross section of the connecting groove is in a shape of waist.

8. The liquid cooling module of an LED lamp according to claim 1, wherein:
   the outlet hole comprises a circular hole section and a joint hole section;
   a first end of the joint hole section is connected to the liquid outlet of the last liquid flowing passage; and
   a second end of the joint hole section is connected to an outer circumference of a middle portion of the circular hole section by a slanted surface.

9. The liquid cooling module of an LED lamp according to claim 8, wherein:
   a section area of the joint hole section is larger than a section area of the first liquid flowing passage; and
   a section area of the joint hole section is larger than a section area of the last liquid flowing passage.

10. The liquid cooling module of an LED lamp according to claim 1, wherein:
    a section area of the connecting groove is larger than a section area of a corresponding one of the side by side liquid flowing passages;
    the section area of the connecting groove is flat;
    two side walls of the connecting groove respectively along a width direction or a length direction are transited to a bottom wall of the connecting groove in a shape of right angle or round angle; and
    a semi-diameter of the round angle is smaller than a preset value.

11. The liquid cooling module of an LED lamp according to claim 1, wherein:
    the at least one heat source is selected from LED light sources, driving sources or the combination; and
    the at least one heat source is connected to the cooling body.

12. The liquid cooling module of an LED lamp according to claim 11, wherein:
    a plurality of liquid cooling modules and a plurality of pipes create a net;
    the liquid cooling module is one of the plurality of liquid cooling modules; and
    inlet holes and outlet holes of the plurality of liquid cooling modules are serially connected by the plurality of pipes to form branches.

13. The liquid cooling module of an LED lamp according to claim 12, wherein:
    the branches are parallelly connected to form the net; and
    an inlet and an outlet of the pipes are disposed outdoor.

14. The liquid cooling module of an LED lamp according to claim 1, wherein:
    at least one wall of the side by side liquid flowing passages is disposed with a plurality of thermal fins spaced at intervals;
    each of the plurality of thermal fins is arranged along a flowing direction of the side by side liquid flowing passages;
    a base of each of the plurality of thermal fins and the cooling body are integrally formed; and
    a gap is disposed between a tail of each of the plurality of thermal fins and an opposite side wall of a corresponding one of the side by side liquid flowing passages or an opposite thermal fin of a corresponding one of the side by side liquid flowing passages.

15. The liquid cooling module of an LED lamp according to claim 14, wherein a top wall or a bottom wall of the side by side liquid cooling passages is disposed with the plurality of thermal fins spaced at intervals.

16. The liquid cooling module of an LED lamp according to claim 15, wherein:
    a plurality of liquid cooling modules and a plurality of pipes create a net;
    the liquid cooling module is one of the plurality of liquid cooling modules; and
    inlet holes and outlet holes of the plurality of liquid cooling modules are serially connected by the plurality of pipes to form branches.

17. The liquid cooling module of an LED lamp according to claim 14, wherein a width of each of the plurality of thermal fins is gradually increased from a tail portion of each of the plurality of thermal fins to a base portion of each of the plurality of thermal fins.

18. The liquid cooling module of an LED lamp according to claim 14, wherein:
    the at least one heat source is an LED lamp; and
    the LED lamp is disposed at a top surface of the cooling body.

19. The liquid cooling module of an LED lamp according to claim 14, wherein:
    a plurality of liquid cooling modules and a plurality of pipes create a net;
    the liquid cooling module is one of the plurality of liquid cooling modules; and
    inlet holes and outlet holes of the plurality of liquid cooling modules are serially connected by the plurality of pipes to form branches.

20. The liquid cooling module of an LED lamp according to claim 1, wherein:
    at least one of the inlet hole or the outlet hole comprises a circular hole section and a joint hole section;
    the circular hole section has a cylindrical sidewall extending from a first end to a second end;
    the joint hole section has a tapered region;
    a first end of the joint hole section connected to the liquid outlet of the last liquid flowing passage or the liquid inlet of the first liquid flowing passage; and
    a second end of the joint hole section defining the tapered region abuts a middle portion of the cylindrical sidewall between the first end and the second end.

* * * * *